United States Patent [19]

Whitlock et al.

[11] Patent Number: 4,531,102

[45] Date of Patent: Jul. 23, 1985

[54] DIGITAL PHASE LOCK LOOP SYSTEM

[75] Inventors: Jonathan B. Whitlock, Bernardsville; Christopher W. Drzala, Paramus, both of N.J.

[73] Assignee: GK Technologies, Incorporated, Greenwich, Conn.

[21] Appl. No.: 470,134

[22] Filed: Feb. 28, 1983

[51] Int. Cl.³ .............................................. H03L 7/06
[52] U.S. Cl. .................... 331/1 A; 331/11; 331/25
[58] Field of Search ............ 331/1 A, 10, 11, 17, 331/18, 25, DIG. 2

[56] References Cited

U.S. PATENT DOCUMENTS

| | | | |
|---|---|---|---|
| 4,034,310 | 7/1977 | Coe | 331/1 A X |
| 4,135,165 | 1/1979 | Coe | 331/1 A X |
| 4,144,489 | 3/1979 | Ward et al. | 331/1 A X |
| 4,151,485 | 4/1979 | LaFratta | 331/1 A |
| 4,272,729 | 6/1981 | Riley, Jr. | 331/1 A |
| 4,316,152 | 2/1982 | Meyer | 331/18 X |

OTHER PUBLICATIONS

Makino, M. et al., "A Microprocessor-Controlled Phase-Locked Loop for Network Synchronization", Conference: Proceedings of the 1979 International Symposium on Circuits and Systems, Tokyo, Japan, (Jul. 17–19, 1979), pp. 804–805.

Primary Examiner—Eugene R. LaRoche
Assistant Examiner—Robert J. Pascal
Attorney, Agent, or Firm—Hopgood, Calimafde, Kalil, Blaustein & Judlowe

[57] ABSTRACT

A macro phase detector responds to large phase deviation between a locally generated signal and a reference signal for actuating a successive frequency approximation register to effect major count alteration in a counter for controlling a digital-to-analog converter and, in turn, a voltage controlled oscillator. Small phase error is detected by a phase detector, averaged, and employed to alter the count in the counter for introducing sensitive frequency adjustment. A second counter is clocked by the phase detector at one half the rate of the first counter and is used to update the first counter each time the phase difference reverses polarity. Loss of reference signal activates a detector for freezing the count in the counter to maintain frequency and phase within the accuracy of the controlled oscillator.

20 Claims, 5 Drawing Figures

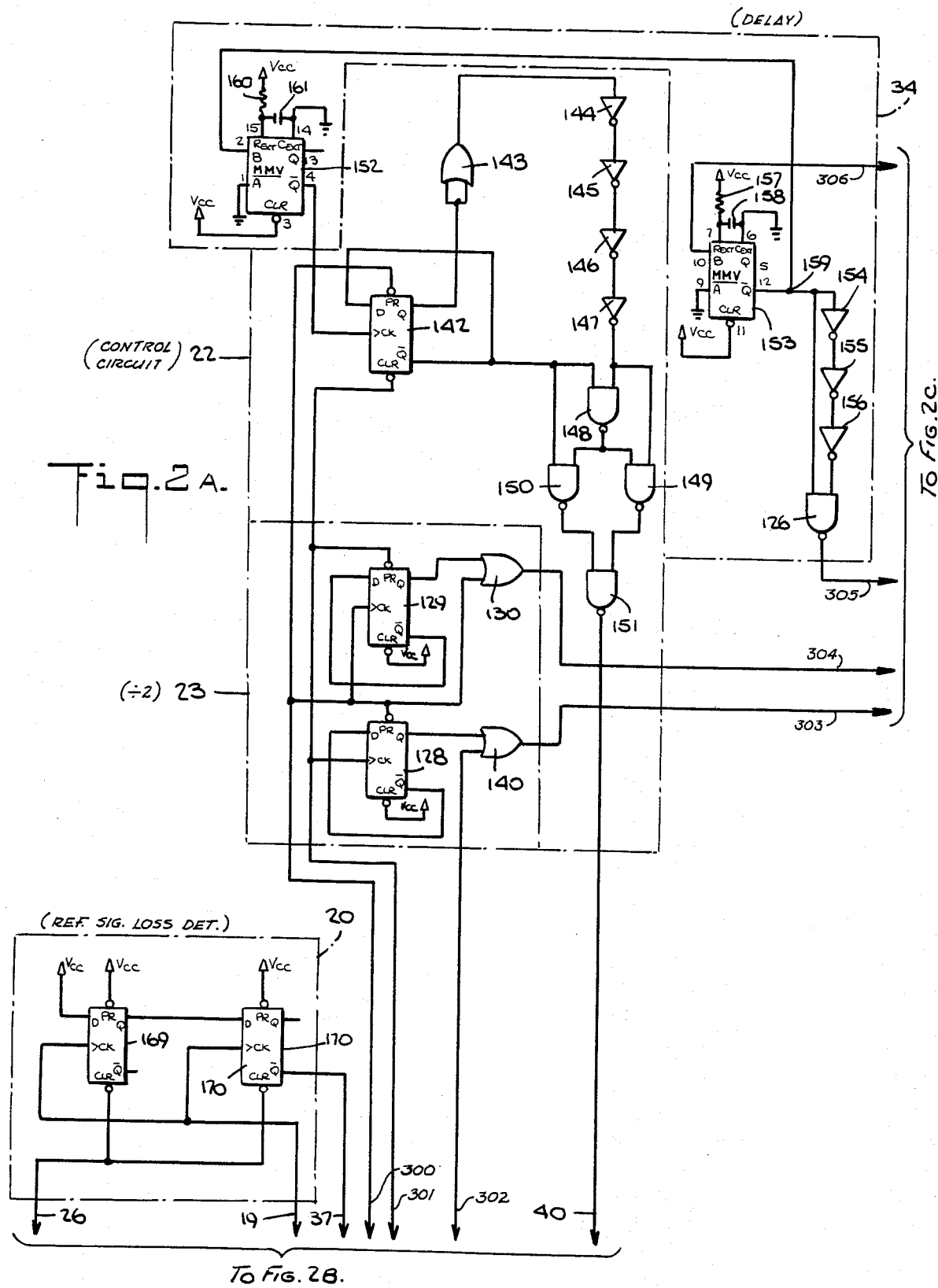

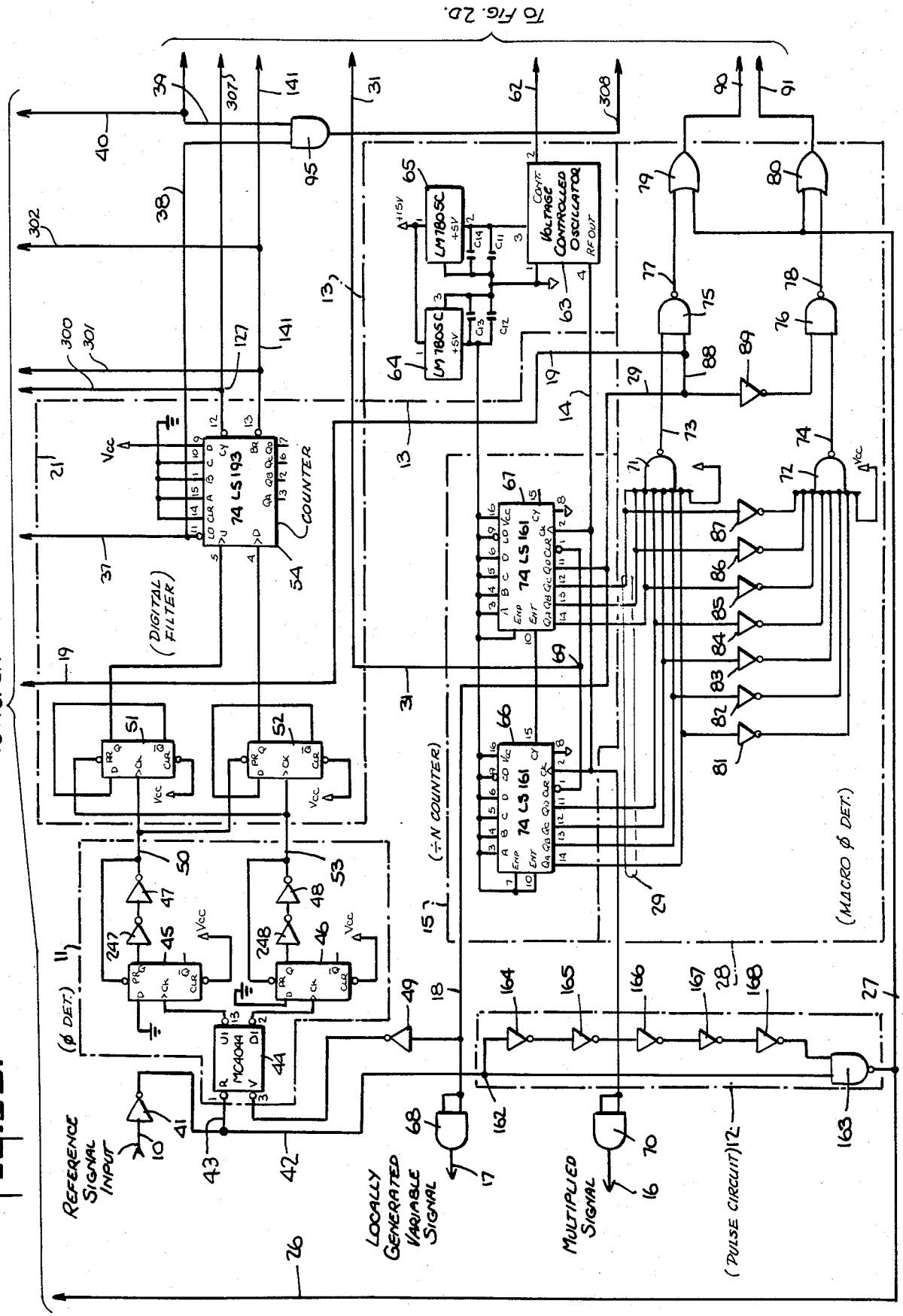

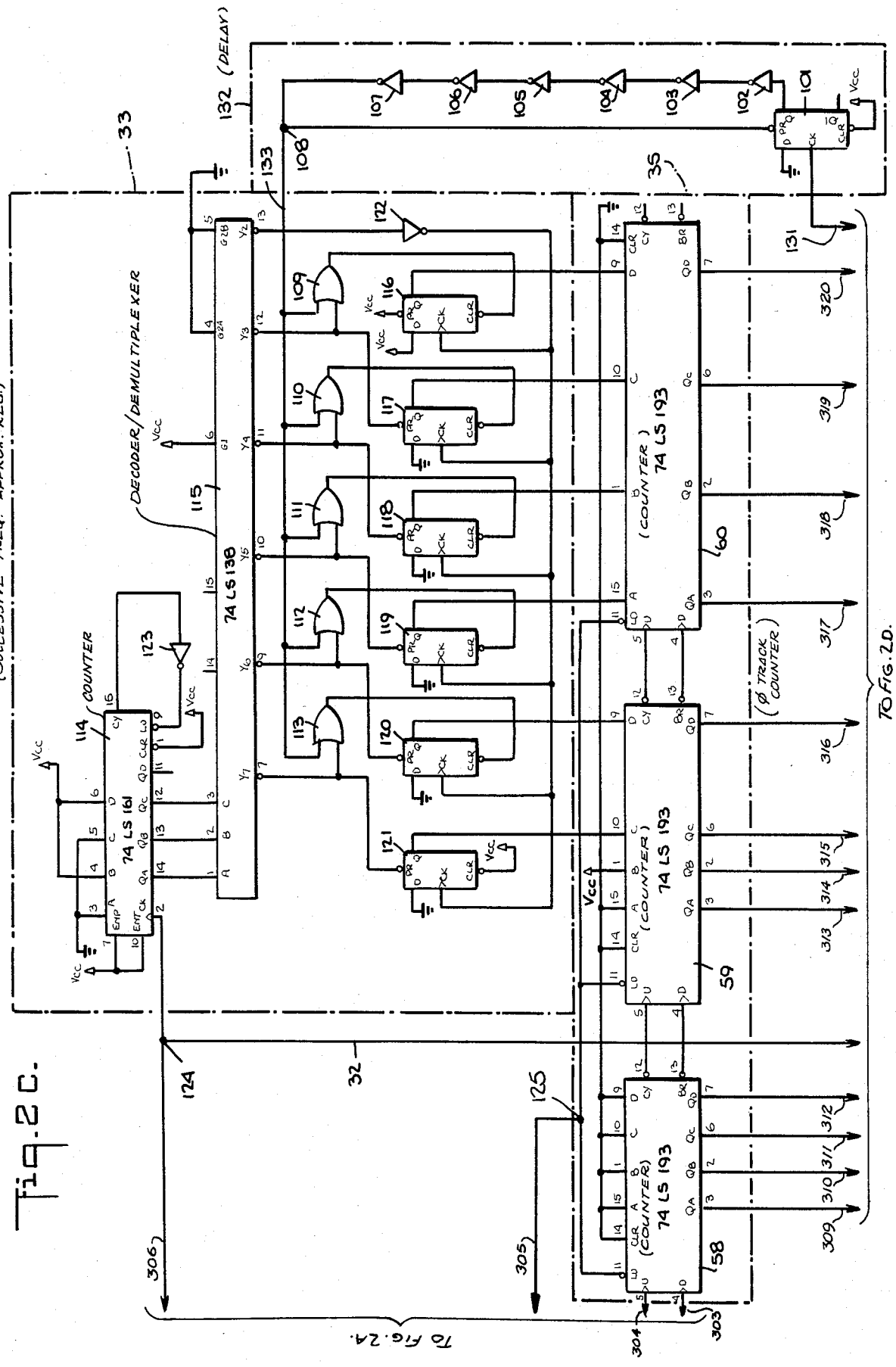

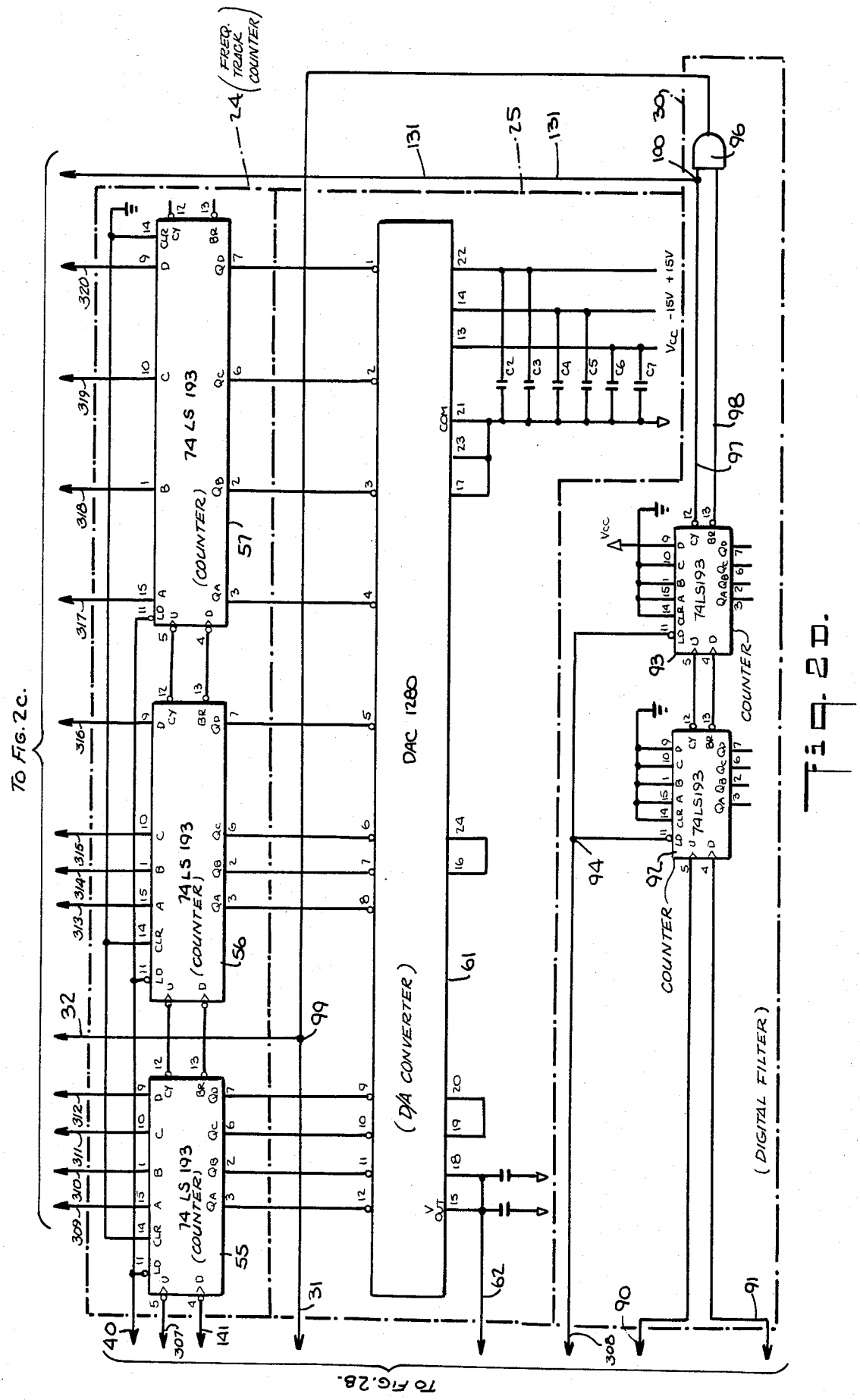

DIGITAL PHASE LOCK LOOP SYSTEM

BACKGROUND OF THE INVENTION

The present invention relates to a phase lock loop system.

There are numerous situations requiring precise phase and frequency synchronization between a local oscillatory source and an external reference signal. For example, in telephone PCM systems there is a need for synchronizing a local oscillator with the frame synchronization signals carried by the incoming transmission. That is, demodulation of the pulse code modulated signals requires an accurately timed clock synchronized with the clock at the point of origin.

For various reasons such as external noise, power surges or interruptions, or the like, the incoming reference clock signals experience interruptions which can vary from a brief fraction of a second to a second or more. Nevertheless, in order to avoid unnecessary loss of the communication signal it is essential that any receiving system have the capability of reacquiring synchronization in the shortest time possible.

In telephone communication, domestic and European PCM systems operate with different carrier frequencies. In Europe the current standard is 2.048 MHz while the American standard is 1.544 MHz, both frequencies having a common factor of 8 KHz. It is thus convenient to use the 8 KHz content of the PCM transmission as a reference signal to which the local oscillators are locked for insuring demodulation with good fidelity.

A phase lock loop is a circuit for maintaining phase coincidence between a local oscillatory source and a reference signal. The basic components of any phase lock loop are a phase detector to which the reference signal and local signal are applied, a filter for smoothing the output of the phase detector, and a controllable oscillator responsive to the filter output for providing the local signal. Both analog and digital as well as hybrid phase lock loop circuits are known. However, we are not aware of any known system that is able to acquire lock consistently in the short span of 1 second or less and, once locked, can maintain frequency and phase with interruptions of the reference signal up to at least one second with no more than 0.2 Hz deviation and 20% phase drift from the reference signal.

It is, therefore, an object of the present invention to provide a digital type phase lock loop system having the ability to quickly acquire lock upon power turn-on, to maintain such lock with close tolerance in the presence of a reference signal, and to bridge short reference signal interruptions with negligible change in local frequency and phase.

SUMMARY OF THE INVENTION

In accordance with one aspect of the invention there is provided a phase lock loop system for synchronizing the frequency and phase of a locally generated alternating current signal with a reference signal comprising in combination an oscillator whose frequency can be varied by application thereto of a control signal, means coupled responsively to said oscillator for providing said locally generated signal at a frequency that is equal to 1/N times said oscillator frequency where N is a positive integer, means for storing a first count and having an output, means coupled to said output of said first count storing means and to said oscillator for providing said control signal to vary the frequency of said oscillator as a function of said first count, means responsively coupled to receive said reference signal and compare the phase thereof with said locally generated signal for providing output signals indicative of a leading or lagging phase relationship, respectively, and means for coupling said last mentioned output signals to said first count storing means for changing said first count in a direction tending to bring said locally generated signal into frequency and phase coincidence with said reference signal; said output signal coupling means including means for changing said first count from a first value to a second value in one direction in response to said output signals corresponding to a leading phase relationship and in the opposite direction in response to said output signals corresponding to a lagging phase relationship, and means responsive to each change of said output signals that is indicative of a reversal in sign of said phase relationship for replacing said first count in said first count storing means with another first count having a value half way between the last occurring first and second values.

BRIEF DESCRIPTION OF THE DRAWINGS

The invention will be better understood after reading the following detailed description of a presently preferred embodiment thereof with reference to the appended drawings in which:

FIGS. 2A to 2D constitute a schematic discrete logic diagram showing the details of the circuit of FIG. 1.

The same reference numerals are used throught the drawings to designate the same or similar parts.

DETAILED DESCRIPTION OF THE PREFERRED EMBODIMENT

Figure 1:
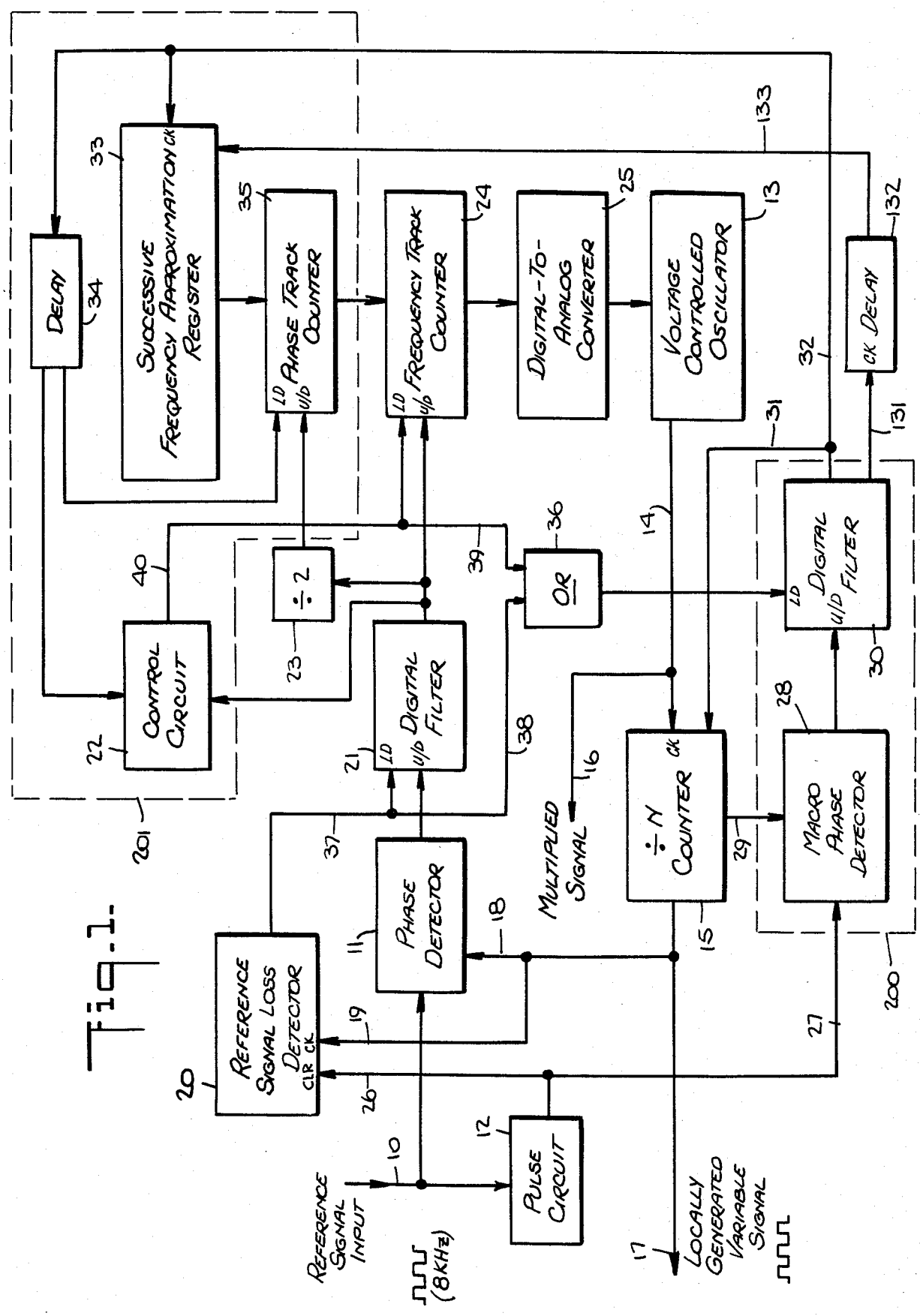
FIG. 1 is a block diagram of a phase lock loop circuit embodying the present invention.

Referring first to FIG. 1, the reference signal in the form of a substantially constant frequency square wave is applied to the circuit at an input 10. For the present example, the input frequency may be 8 KHz. The reference signal is fed in parallel to a phase detector 11 and a pulse circuit 12. A voltage controlled oscillator 13 furnishes an output over path 14 to one input of a ÷N counter 15 in parallel with a multiplied signal output 16. The output from counter 15 is connected to an output 17 for a variable signal output, to another input 18 of the phase detector 11, and over path 19 to a reference signal loss detector 20.

The output from phase detector 11 is applied to a digital filter 21 whose output is furnished to a control circuit, 22, a ÷2 circuit 23, and a frequency track counter 24. The counter 24 has an output connected to a digital-to-analog converter 25 having an output that is applied to the oscillator 13.

Referring back to the pulse circuit 12, it has an output connected over path 26 to another input of the reference signal loss detector 20, and over path 27 to a macro phase detector 28 having a second input supplied over path 29 from counter 15. The output from macro phase detector 28 is coupled through a digital filter 30 to several paths. One path, 31, connects with another input of counter 15 while a second path, 32, connects to an input of a successive frequency approximation register 33. Path 32 also communicates through a delay circuit 34 with both the control circuit 22 and with a phase track counter 35. A still further output, 131, from filter 30 is fed through a delay circuit 132 and path 133 to another input to the successive frequency approximation register 33.

The successive frequency approximation register has an output feeding the phase track counter 35, which, in turn, feeds the frequency track counter 24. Another input to the counter 35 is obtained from ÷2 circuit 23, and a third input to counter 35 is coupled to receive an output from the delay circuit 34.

An OR circuit 36 is provided having its output coupled to the digital filter 30. One input of circuit 36 receives an output over paths 37 and 38 from the reference signal loss detector 20. The other input of OR circuit 36 is coupled over paths 39 and 40 to an output from control circuit 22. The same output from circuit 22 is also connected to the frequency track counter 24.

Before discussing the operation of the circuit shown in FIG. 1 it will be helpful to have a better understanding of each of the components and for this purpose attention should be directed to FIG. 2. Standard symbols are used to designate the various logic components. Letters within the symbol outline identify terminal functions while the small numbers adjacent leads just outside the symbol margins designate the pin numbers for the particular component. Type number designations appear in the drawings only on counters and decoders, all other type numbers are tabulated later in this description. It is to be understood, however, that specific part numbers are given only by way of example as a description of an exemplary embodiment. Reference numerals commencing with "300" are used to identify leads passing between drawing sheets and are not otherwise mentioned in the following discussion.

Considering the circuit, the reference signal input at 10 (FIG. 2B) passes through an inverter 41 to leads 42 and 43, the latter leading to the (R) input of a type MC4044 phase-frequency detector 44 in phase detector circuit 11. Utilizing only phase detector #1 in component 44, the (U1) and (D1) outputs are connected to the clock (CK) inputs of two D-type positive-edge-triggered flip-flops 45 and 46 that are interconnected in phase detector 11 with respective inverters 47, 247, 48 and 248, as shown. Each of the flip-flops 45 and 46 has its Q output connected back to its preset terminal through the corresponding inverters, 47 and 247 for flip-flop 45, and 48 and 248 for flip-flop 46. In known manner, the cascaded inverters will introduce a brief time delay from their input to their output. The data inputs of the flip-flops 45 and 46 are connected each to ground or logical 0. The (V) input of component 44 is connected to the output of an inverter 49 whose input receives the output over lead 18 from ÷N counter 15. The signal on lead 18 represents the locally generated variable signal.

The output from inverter 47 on lead 50, constituting one output of phase detector 11, is connected to the clock and preset inputs, respectively, of D-type positive-edge-triggered flip-flops 51 and 52. Similarly, the output from inverter 48 on lead 53, constituting the second output of phase detector 11, is connected to the clock and preset inputs, respectively, of flip-flops 52 and 51. The D input of each of flip-flops 51 and 52 is connected to its corresponding $\bar{Q}$ output establishing the flip-flops as bistable for frequency division by a factor of two.

The Q output of flip-flop 51 is connected to the UP count input (U) of a Synchronous 4-bit Up/Down Counter 54 whose DOWN count input (D) is connected to the Q output of flip-flop 52. As shown, the A, B and C data inputs and the CLEAR input (CLR) of counter 54 are all connected to digital ground, i.e., to logical 0. The D data input is connected to a source of positive voltage applying a logical 1 thereto. In the present example the Q outputs are not used. However, the CARRY and BORROW outputs (CY and BR) provide the two outputs from the digital filter 21 and are connected, respectively, to the UP and DOWN count inputs of a Synchronous 4-Bit Up/Down Counter 55 (FIG. 2D) which is cascaded, as shown, with additional counter stages 56 and 57, both of the same type as counter 55. The counters 55, 56 and 57 constitute the frequency track counter 24. As shown, the CLEAR inputs of all three counters 55-57 are connected to logical 0.

The phase track counter (FIG. 2C) consists of three more Up/Down Counters 58, 59 and 60, identical to counters 54-57, and connected in cascade. Further discussion of these components will be found below.

The digital-to-analog converter 25 (FIG. 2D) is implemented by a National Semiconductor type DAC1280 12-Bit (Binary) Digital-to-Analog Converter 61. The converter 61 is connected to establish on output lead 62 a voltage that is variable between 0 and 5 Volts in 4096 steps with the most significant bit entered at the right at pin 1 and the least significant bit at the left at pin 12. Each of the track counters 24 and 35 has a 12-bit output and these are connected for parallel transfer from counter 35 (FIG. 2C) to counter 24 (FIG. 2D) and from counter 24 to converter 61. Thus the $Q_A$ output from counter stage 58 is connected to the A Data input of counter stage 55 whose $Q_A$ output is connected to pin 12 of the converter 61. In similar fashion the successive ordered outputs from the counter stages 58, 59 and 60 are connected to corresponding data inputs of stages 55, 56 and 57 while the outputs from the latter stages are connected to corresponding inputs through pins 1 to 11 of the converter 61.

The voltage controlled oscillator component 13 (FIG. 2B) includes the oscillator 63 and two voltage regulators 64 and 65. The regulators 64 and 65 may be type LM7805C units providing a regulated +5 V. output from a +15 V. supply. The oscillator 63 can be a crystal stabilized type CO-231V oscillator with a center frequency of 2048 KHz manufactured by Vectron Laboratories, Inc. of Norwalk, Conn. This oscillator has a TTL output and responds to a 0 to 5 Volt modulation for varying its output frequency approximately ±50 ppm, i.e., approximately ±102 Hz around a center frequency of 2048 KHz.

Two synchronous 4-bit counters 66 and 67, of type 74LS161, are connected in cascade to provide the ÷N function. The 2048 KHz output from oscillator 63 on lead 14 is connected to the CLOCK inputs of each of counters 66 and 67 with the ripple carry output, CY, of counter 66 feeding the enable T input, ENT, of counter 67 to provide at the various Q outputs the usual scaled down signals in known manner. Thus, the oscillator 63 will have its output divided by N=256 at the $Q_D$ output of counter 67 and this is furnished to lead 18, and through AND gate 68 to output 17. As shown, the ENT terminal of counter 66, along with that counter's enaple P input, ENP, data input terminals A, B, C and D, load terminal, LD, and Vcc terminal, are connected together and to the +5 V. regulated output from regulator 64. Similarly, counter 67 has its ENP terminal, data input terminals A, B, C and D, LD terminal and Vcc terminal connected together and to the same +5 V. regulated output from regulator 64. The CLEAR inputs of counters 66 and 67 are connected together at junction 69 to which is connected lead 31 whose opposite end connection will be discussed later.

The same signal furnished to the CLOCK inputs of counters 66 and 67 is fed through AND gate 70 to the multiplied signal output 16. This represents a buffered direct output from oscillator 63 at a nominal frequency of 2048 KHz. This frequency will actually vary within the controlled range of oscillator 63.

The macro phase detector 28 includes a pair of 8-input NAND gates, 71 and 72, having outputs 73 and 74 connected, respectively, to one input of a corresponding 2-input NAND gate 75 or 76. The outputs 77 and 78, respectively, of the latter gates are connected, in turn, to one input of a corresponding 2-input OR gate 79 or 80. As shown, the four Q outputs from counter 66 and the $Q_A$, $Q_B$ and $Q_C$ outputs from counter 67 are connected directly to seven of the inputs of NAND gate 71 and through individual inverters 81–87 to seven of the inputs of NAND gate 72. The eighth input of each of gates 71 and 72 is connected to logical 1. The $Q_D$ output of counter 67 is also connected, as shown, directly to the second input of gate 75 through a lead 88 and through an inverter 89 to the second input of gate 76. The signal on lead 88 is also connected to lead 19 feeding the reference signal loss detector 20.

Two outputs are obtained from the macro phase detector 28 over leads 90 and 91 connected to the respective outputs of OR gates 79 and 80. The lead 90 feeds the UP count input of a synchronous 4-bit UP/DOWN counter 92 (FIG. 2D) of the same type as counters 55 to 60. The counter 92 is cascaded with an identical counter 93, the carry output CY of counter 92 feeding the UP count input U of counter 93 while the borrow output BR of counter 92 feeds the DOWN count input D of counter 93. None of the Q outputs of counters 92 and 93 is utilized while all of the data and clear inputs, A-D and CLR of counter 92 and A-C and CLR of counter 93 are connected to logical 0. The data input terminal D of counter 93 is connected to logical 1. The input load terminals, LD, of both counters 92 and 93 are connected together at a junction 94 fed from the output of an AND gate 95 in OR circuit 36.

An AND gate 96 is included in digital filter 30 along with counters 92 and 93. Gate 96 has two inputs, one of which is connected over lead 97 to the CY output terminal and the other of which is connected over lead 98 to the BR output terminal of counter 93. The output from gate 96 is connected to a junction 99 to which is connected the leads 31 and 32, previously mentioned.

Another output from the digital filter 30 is derived from the CY terminal of counter 93 via lead 97 and a tap 100. The tap 100 is connected to lead 131 that feeds the delay circuit 132 (FIG. 2C). The latter circuit includes a D-type positive-edge-triggered flip-flop, 101, and a series of six inverters 102–107 that are connected in cascade. The Q output of flip-flop 101 is connected to the input of inverter 102 while the output of inverter 107 is connected through junction 108 back to the preset input terminal PR of flip-flop 101. The D and CLEAR inputs of flip-flop 101 are connected, respectively, to logical 0 and 1.

Proceeding from junction 108 the delayed signal is fed to lead 133 which connects, in parallel, with one input each of the OR gates 109, 110, 111, 112 and 113, in the successive frequency approximation register 33. The register 33 also includes a synchronous 4-bit counter 114, a decoder/demultiplexer 115, six D-flip-flops 116, 117, 118, 119, 120 and 121, and inverters 122 and 123. The data input terminals A and C of counter 114 are connected to logical 0. The input terminals B and D are connected to logical 1. Both terminals ENP and ENT are connected to logical 1. The CY output terminal is connected through inverter 123 to the input load terminal, LD. The CLR terminal is connected to logical 1. Only the $Q_A$, $Q_B$ and $Q_C$ outputs are used and these are connected to the corresponding select terminals A, B and C of decoder/demultiplexer 115. The clock input terminal, CK, of counter 114 is connected through junction 124 to the lead 32.

Of the three enable inputs of decoder/demultiplexer 115, G1 is connected to logical 1 while G2A and G2B are connected to logical 0. Only six of the eight data outputs of this circuit are utilized, as shown. Specifically, the Y2 output is connected through inverter 122 to the CLOCK inputs of all of the flip-flops 116–121. The Y3 output is connected to the second input of OR gate 109 and to the preset input, PR, of flip-flop 117. The output of OR gate 109 is connected to the CLEAR input, CLR, of the adjacent flip-flop 116. In similar manner the Y4–Y7 outputs are connected each to another input of the corresponding OR gates 110–113 and to the preset input of the corresponding flip-flops 118–121. The outputs from OR gates 110–113 are connected to the CLR inputs of flip-flops 117–120, respectively. The D input of flip-flop 116 and the CLR input of flip-flop 121 are connected to logical 1. The D inputs of flip-flops 117–121 are all connected to logical 0. Finally, the Q outputs of flip-flops 121, 120, 119, 118, 117 and 116 are connected, respectively, to the data input terminals, C and D of counter 59, and A, B, C and D of counter 60, the counters 59 and 60 being part of the phase track counter circuit 35, previously described.

The data input terminal B of counter 59 is connected to logical 1. The CLR terminals of counters 58, 59 and 60 are connected to logical 0 along with the data input terminals A, B, C and D of counter 58 and the data input terminal A of counter 59. The data input load terminals, LD, of the counters 58–60 are connected together at a junction 125 that is connected to the output of a NAND gate 126. The latter is included in the delay circuit 34 (FIG. 2A).

Directing attention back to the output from digital filter 21 (FIG. 2B), the CY output terminal of counter 54 is connected via junction 127 to the preset input terminal of a D-flip-flop 128 (FIG. 2A) and to the clock input terminal of another D-flip-flop 129. Both flip-flops 128 and 129 are part of the ÷2 circuit 23 along with two OR gates 130 and 140. One input of gate 130 is connected to the Q output of flip-flop 129 while the other input of gate 130 is connected back to junction 127. The output from gate 130 is connected to the UP count input of counter 58 in the phase track counter 35 (FIG. 2C).

The Q output from flip-flop 128 (FIG. 2A) is connected to one input of gate 140 while the other input of gate 140 is connected via lead 141 to the BR terminal at the output of counter 54. Lead 141 is also connected to the clock input of flip-flop 128 and to the preset input of flip-flop 129. Both of the flip-flops 128 and 129 have their respective $\overline{Q}$ outputs connected to their respective D inputs. The CLR input terminal of each is connected to logical 1. The output from gate 140 is connected to the DOWN count input of counter 58 (FIG. 2C).

Control circuit 22 (FIG. 2A) includes a D-flip-flop 142 whose preset and clear inputs are connected, respectively, to junction 127 and lead 141. The Q output of flip-flop 142 is connected through OR gate 143 in cascade with four inverters 144, 145, 146 and 147 to one input of each of the NAND gates 148 and 149. The $\overline{Q}$ output of flip-flop 142 is connected back to its D input and to one input of each of the NAND gates 148 and 150. The output of gate 148 is connected to the second input of each of gates 149 and 150 while the outputs from gates 149 and 150 are connected, respectively, to the two inputs of NAND gate 151. Gate 151, in turn, has its output connected to lead 40, with the junction between leads 39 and 40 being connected to the input load terminals of counters 55, 56 and 57.

Two retriggerable monostable multivibrators 152 and 153 are included in delay circuit 34 along with NAND gate 126 and three inverters 154, 155 and 156. A connection is provided from junction 124 to the B input of multivibrator 153. The A input of multivibrator 153 is connected to logical 0. The CLR terminal is connected to logical 1. The R external terminal is connected through a resistor 157 to logical 1 and through capacitor 158 to both the C external terminal and to logical 0. The $\overline{Q}$ output of multi-vibrator 153 is connected via junction 159 to the B input of multivibrator 152, one input of gate 126 and the input to inverter 154. Similarly, the multivibrator 152 has its R external terminal connected both through a resistor 160 to logical 1 and through a capacitor 161 to the C external terminal and to logical 0. The A input of multivibrator 152 is connected to logical 0, the CLEAR input is connected to logical 1 and the $\overline{Q}$ output is connected to the clock input of flip-flop 142.

Now viewing lead 42 (FIG. 2B), it is connected via junction 162 to one input of a NAND gate 163 and to the input of the first inverter 164 of a cascade of five inverters 164, 165, 166, 167 and 168. The output of the inverter 168 is connected to the second input to gate 163. The components 163-168 constitute the pulse circuit 12 with the output from gate 163 feeding leads 26 and 27.

Lead 26 is connected to the CLEAR inputs of two D-flip-flops 169 and 170 (FIG. 2A). The D and preset inputs of flip-flop 169 and the preset input of flip-flop 170 are connected to logical 1. The Q output of flip-flop 169 is connected to the D input of flip-flop 170. The clock inputs of both flip-flops 169 and 170 are connected together and through lead 19 to lead 88 (FIG. 2B) in macro phase detector 28. Finally, the $\overline{Q}$ output of flip-flop 170 is connected via lead 37 to the data input load terminal LD of counter 54 and through lead 38 to an input of gate 95.

Satisfactory results have been obtained with an embodiment in which the components identified in the following table by reference numeral were of the listed type and/or value. Where the type designation of a component appears on the drawing it is not repeated in the table.

TABLE I

| Part | Reference Nos. |
| --- | --- |
| Inverter - 74 S 04 | 41, 49, 81–89, 122, 123 |
| Inverter - 74 LS 14 | 47, 48, 102–107, 144–147, 154–156, 164–168, 247, 248 |
| AND Gate - 74 S 08 | 68, 70, 95, 96 |
| NAND Gate - 74 S 00 | 75, 76, 126, 148–151, 163 |
| NAND Gate - 74 S 30 | 71, 72 |

TABLE I-continued

| Part | Reference Nos. |
| --- | --- |
| OR Gate - 74 LS 32 | 79, 80, 109–113, 130, 140 |
| D Flip-Flop - 74 S 74 | 45, 46, 51, 52 |
| D Flip-Flop - 74 LS 74 | 101, 116–121, 128, 129 142, 169, 170 |
| MV - 74 LS 123 | 152, 153 |
| Resistor - ¼ W, 10K ohms | 157, 160 |
| Capacitor - 20 μμf | 158, 161 |
| Capacitor - 1 μf tantalum electrolytic | $C_2, C_4, C_6$ |
| Capacitor - 0.01 μf ceramic disc | $C_3, C_5, C_7$ |
| Capacitor - 0.1 μf | $C_1, C_{10}, C_{11}, C_{12}$ |
| Capacitor - 1000 μμf | $C_{13}, C_{14}$ |

The operation of the phase lock loop circuit can now be discussed. Commencing with the reference signal input at terminal 10 it is applied to the phase detector 11 and compared as to phase with the locally generated variable signal obtained from the $Q_D$ output of the counter 67 in the ÷N circuit 15. Depending upon whether the locally generated signal leads or lags the reference signal an output pulse will appear on either lead 50 or 53 from the phase detector 11. This output pulse will be in the form of a negative going spike having a pulse width dependent upon the delay introduced by the corresponding cascaded inverters 47, 247 or 48, 248. The flip-flops 51 and 52 in the digital filter 21 are bistable and provide one output pulse for each two input pulses. When the locally generated signal leads the reference signal the pulse will appear at the UP count input of counter 54. When the locally generated signal lags the reference signal the pulses will appear at the DOWN input of counter 54. In effect, the counter 54 averages the pulses received from the phase detector 11. Whenever counter 54 either overflows or underflows an output pulse will appear at the CY or BR terminal, respectively. Signals appearing at the output of the filter 21 are applied as either an increment (addend) or decrement (subtrahend) to the count in the frequency track counter 24 depending upon whether the pulses appear at the UP or DOWN count input.

As an example, if the local signal is leading the reference signal, negative going pulses will appear at junction 127 at the output of filter 21. These pulses are applied to the ÷2 circuit 23 which initially is in random state. Upon application of the first pulse from the digital filter 21, one of the flip-flops 128 or 129 is driven by the pulse on its preset input to the ON state with Q=1. The other flip-flop will commence the division operation providing one pulse for every two input pulses. In the example with a signal at junction 127 the flip-flop 128 is set while the flip-flop 129 is clocked either ON or OFF depending upon its previous state. It will be observed that after division by a factor of 2 the pulses corresponding to a leading local signal will be applied to the UP count input of the first counter stage 58 in the phase track counter 35. Thus, the phase track counter 35 will advance at one half the rate of the frequency track counter 24.

Conversely, if the locally generated signal should lag the reference signal, the pulses from the phase detector 11 will pass through the DOWN count input of the filter 21 and appear on lead 141 at the DOWN count input of counter 55 in the frequency track counter 24. At the same time, such pulses will be applied at one half rate through the circuit 23 to the DOWN count input of counter 58 in phase track counter 35.

Every time a pulse appears at junction 127 it is also applied to the preset input of the D-flip-flop 142 in control circuit 22. Conversely, whenever a pulse appears on lead 141 it is applied to the CLR input of the flip-flop 142. Thus, flip-flop 142 will alternate its state upon receiving pulses alternately from junction 127 and lead 141.

Recognizing that the gate 143 and inverters 144–147 provide a time delay and that gates 148–151 constitute an exclusive OR network, it should be apparent that any change of state of flip-flop 142 will produce a negative going pulse at the output of gate 151 on lead 40. When this pulse is applied to the LD terminals of counters 55–57 it will function to transfer the count value from the phase track counter 35 to the frequency track counter 24.

For the present it is convenient to ignore the signals applied to the clock input of flip-flop 142. The effect of such signals will be discussed later. Limiting discussion to the appearance of pulses at the output of filter 21 it will be appreciated that a shift from pulses appearing at junction 127 to those appearing on lead 141 or vice versa will occur substantially coincident with the change in phase relationship between the locally generated signal and the reference signal as such relationship passes through zero phase difference from either a leading to a lagging or a lagging to a leading situation. In the overall operation of the present system it can be assumed that a pulse appears on lead 40 to load a count into the frequency track counter 24 substantially at the moment of phase coincidence.

The count loaded into the frequency track counter 24 is applied to the control input of the digital-to-analog converter 61 for controlling its output voltage on lead 62 that regulates the frequency of oscillator 63. During operation of the system the voltage from the converter 61 will have a sinusoidal envelope. The peaks of the envelope will substantially coincide with the moment at which phase coincidence occurs between the reference and variable signals. Between successive transfer of count from the phase track counter 35 to the frequency track counter 24 the latter counter will have its count increased or decreased solely by the output from the digital filter 21 and will cause the frequency of oscillator 63 to vary between two limits symmetrically disposed about the reference signal frequency. If it is considered that the peak-to-peak frequency from the oscillator 63 corresponds to a certain number of voltage steps from the converter 61, it should be understood that altering the controlling count by one half the previous excursion will theoretically update the converter 61 to correspond to frequency coincidence with that of the reference signal. This is the implication of the ÷2 circuit 23 and the half count rate obtained from the phase track counter 35.

When the system is initially turned on the converter 61 may be at any one of its 4096 count conditions. The locally generated variable signal can be either leading or lagging the reference signal input.

The pulse circuit 12 will provide at the output of gate 163 a series of negative going spikes coinciding with the leading edges of positive going pulses appearing at the output of inverter 41 due to the reference signal input. So long as these pulses appear at the output of gate 163 they will be applied over lead 26 to the CLR input of both flip-flops 169 and 170 in the reference signal loss detector 20. The application of such pulses will maintain flip-flop 170 in the reset condition with $\overline{Q}=1$ and circuit 20 may be ignored under such condition. At the same time, the pulses are applied from gate 163 over path 27 to the OR gates 79 and 80. The outputs from gates 79 and 80 are normally high and pass the negative pulse from lead 27 only when the second input to the respective gate is at logical 0. Except for a narrow window centered around phase coincidence between the locally generated signal and the reference signal, the output 77 from gate 75 will be low whenever the locally generated signal is leading the reference signal and high at other times while the output 78 from gate 76 will be low when the local signal is lagging the reference signal. Observing that the counter circuit 15 counts the pulses from the voltage controlled oscillator 63 with the count proceeding from 0 to 255 and repeating, the output 73 from gate 71 will be at logical 0 only at the counts of 127 and 255 while the output 74 from gate 72 will be at logical 0 at the counts of 0 and 128. For all other counts the outputs 73 and 74 will be at logical 1. Consequently, output 77 from gate 75 will be at logical 0 to enable gate 79 for the counts of 128 to 254, inclusive. Similarly, gate 80 will be enabled for the counts of 1 to 127, inclusive. Both gates 79 and 80 will be disabled for the counts of 0 and 255 corresponding to a near phase coincidence relationship between the output from oscillator 63 and the reference signal input. Therefore, for all but a slight phase difference, gate 79 will pass pulses when the locally generated signal leads the reference signal while gate 80 will pass pulses when the relationship is lagging.

The preset connections for the counters 92 and 93 in the digital filter circuit 30 are such as to load initially a count of 128. Whenever a phase error or difference persists long enough to either overload or underload the counters 92 and 93 relative to their initial count, negative going pulses will appear on either output line 97 or 98. In the absence of such pulses both lines 97 and 98 will be at logical 1. Hence, the output from gate 96 is normally at logical 1 but contains a negative pulse each time a negative pulse appears on lead 97 or 98. This negative pulse output from gate 96 will accomplish a series of functions. First, the pulse is applied over lead 31 through junction 69 to the CLR inputs of counters 66 and 67 for resetting them to zero count. Bearing in mind that the pulse appearing at the output of gate 96 coincides with the pulse at the output of gate 163 that corresponds to the leading edge of the positive going pulse due to the reference signal input, it should be understood that resetting the counters 66 and 67 to zero will, in effect, shift the locally generated variable signal at that moment to substantial phase coincidence with the reference signal input.

The output pulse from gate 96 also passes through junction 99 and lead 32 to junction 124 and into the clock input of counter 114. Simultaneously, the pulse is applied to the B input of multivibrator 153. The latter is of the type to trigger at the positive going edge of a pulse. Therefore, it is not effected by the pulse applied to its B input until termination of the negative pulse from gate 96. The counter 114 is also clocked by the positive edge of the pulse and, therefore, is advanced one count at the same time that the multivibrator 153 initiates a timing cycle.

The counter 114 is connected to proceed through a six count cycle between conditions corresponding to the counts from 10 to 15 with the overflow pulse at the CY output being used to reset the counter to a count of 10. The output from counter 114 operates to sequence the decoder/demultiplexer 115 through sequential selection of one of its six output terminals Y₂ through Y₇. The selected output terminal will provide a logical 0 on the output lead connected thereto. If it is considered that the flip-flops 116 to 121 represent individual bits in a count with the most significant bit being allocated to flip-flop 116 and the least significant bit being allocated to flip-flop 121 it will be appreciated that a logical 0 at output terminal Y₂ of circuit 115 will set flip-flop 116 while resetting the remaining flip-flops 117 to 121 such that the most significant bit is at logical 1 while the remaining bits are at logical 0. Bearing in mind that there are six less significant bits accommodated by the cascaded counters 58–60, the logical 1 set in flip-flop 116, when transferred to phase track counter 35, represents a count of 2048. However, because of the logical 1 applied to the B input terminal of counter 59 there is always an offset equal to a count of 32 added to the count loaded into the phase track counter 35.

So long as gates 109 to 113 are disabled by a logical 1 on lead 133 from the delay circuit 132, each step in the circuit 115 brought about by a sequencing of counter 114 will increase the count loaded into the phase track counter 35. Junction 108 in delay circuit 132 will remain at logical 1 until such time as flip-flop 101 receives a clock input pulse from the output lead 97 in the filter 30 via junction 100 and lead 131. Pulses appear on lead 97 only when the locally generated signal is leading the reference signal in phase. Whenever a leading condition prevails, a pulse will be applied over lead 131 to clock the flip-flop 101 to its reset condition with $Q=0$ which, after a delay through the inverters 102–107, is fed back through junction 108 to the preset input terminal of flip-flop 101 to restore flip-flop 101 to its $Q=1$ condition. Considering the output signal from circuit 115 as being a means for selecting which one of the gates 109 to 113 is to be enabled, that selected gate will pass a pulse from the delay circuit 132 serving to clear or reset the flip-flop to which the output of the gate is connected. If, for example, an output appears at the Y₄ terminal of circuit 115 it will preset flip-flop 118 corresponding to a count increment of 512. At the same time, gate 110 will be enabled to respond to a negative pulse from delay circuit 132 causing flip-flop 117 (the next higher ordered flip-flop) to be reset removing its count having a value of 1024. Thus, there is a net decrease of 512 in the count.

It should now be appreciated that the successive frequency approximation register 33 cycles through a sequence of operation in response to each pulse from gate 96. At least within said sequence a series of counts are established with each count differing from the preceding count by an amount given by the expression $a/2^{(n-1)}$ where a is a constant and n is a positive integer representing the position of the count in the sequence, each successive count being either smaller or larger than the immediately preceding count depending upon whether the locally generated signal is leading or lagging the reference signal. In the present example, a has a value of 2048, the numerical value of the most significant bit in counter 35. If the output at gate 96 is due to a leading phase relationship between the local and reference signals the particular count selected by the successive frequence approximation register 33, when entered in phase track counter 35, will be smaller. If there is a lagging relationship between the variable and reference signals then the count introduced from the frequency approximation register 33 will be larger.

After a sufficient period of time to enable the components 109 to 123 to stabilize condition, multivibrator 153 will return to its stable condition with $\overline{Q}=1$. This will serve to trigger multivibrator 152 and, at the same time, apply through the gate 126 a brief negative pulse to enable the LD inputs of counters 58, 59 and 60 to load the count from the successive frequency approximation register 33 into the phase track counter 35.

At some time interval later determined by the time constant of multivibrator 152 the $\overline{Q}$ output terminal thereof will provide a logical 1 signal to clock the flip-flop 142 to change its state. As previously explained, any change in state of flip-flop 142 will result in a pulse appearing at the output of gate 151 which, over lead 40, is applied to the LD terminals of counters 55, 56 and 57 for now loading the count previously stored in phase track counter 35 into frequency track counter 24.

One other function is performed by the pulse at the output of gate 151 and this results from its application to gate 95 and from gate 95 to the LD terminals of counters 92 and 93 in the filter 30. This pulse resets the counters 92 and 93 to a count of 128 as previously mentioned.

So long as the voltage controlled oscillator 63 is operating it will supply clock pulses to the counters 66 and 67 in ÷N circuit 15 resulting in a continuous sequence of pulses appearing both at the locally generated variable signal output terminal 17 from gate 68 and on lead 19 furnishing pulses to the clock inputs of flip-flop 169 and 170 in the reference signal loss detector circuit 20. Noting that the D input of flip-flop 169 is connected to logical 1, a clock pulse on its input will set flip-flop 169 to $Q=1$. If no signal is received to reset flip-flop 169 before the next succeeding clock pulse is received from lead 19, flip-flop 170 will now have a logical 1 on its D input and will be clocked so that $\overline{Q}=0$. This condition will occur whenever there is an interruption in or absence of the reference signal input at terminal 10.

A logical 0 appearing at the $\overline{Q}$ output of flip-flop 170 causes counter 54 in digital filter 21 to be loaded with a count of "eight". So long as the load enable terminal of counter 54 is maintained at a logical 0 such counter is disabled from responding to pulses appearing at either its UP or DOWN count input. Therefore, there will be no output pulses appearing at either the CY or BR output terminals of counter 54.

At the same time, the logical 0 appearing on lead 37 is applied through lead 38 and gate 95 to the load enable terminals of counters 92 and 93 to similarly lock said counters at a fixed count of 128. It should be apparent that locking counters 54, 92 and 93 as just described will "freeze" the count preexisting in the frequency track counter 24 so that the frequency of oscillator 63 is maintained at that value existing immediately prior to the interruption or disappearance of the reference signal. The stability of the oscillator 63 is such that for an interruption of the reference signal of up to at least one second there will result less then 0.2 Hz deviation from the preestablished frequency causing a phase drift of less than 20%. If the reference signal returns within one second, reacquisition of phase and frequency coincidence will occur in a fraction of a second.

To summarize the operation of the system, the phase detector 11 compares the phase between the locally generated variable signal and the reference signal and provides an output pulse on either lead 50 or 53 depending upon the sign of the phase difference. The digital filter 21 averages the output pulses from the phase detector 11 to introduce a certain degree of smoothing.

The ÷2 circuit 23 divides in half the output frequency from the digital filter 21. The phase track counter 35 is a 12-bit UP/DOWN counter that is clocked by the output of the ÷2 circuit 23. The count value in the phase track counter 35 is replaced by loading directly from the successive frequency approximation register 33 whenever the latter circuit is called into operation. The frequency track counter 24 is also a 12-bit UP/DOWN counter and it is clocked by the output from the digital filter 21. The count value is replaced by loading a count therein from the phase track counter 35, (a) when the output from the digital filter 21 changes direction corresponding to a change in sign of the phase relationship between the reference signal and the locally generated signal, and (b) when the macro phase detector sequences the successive approximation register 33.

The ÷N counter 15 divides the output from the voltage control oscillator 63 by the factor N, here equal to 256, and the result of this division is the locally generated variable signal. The locally generated variable signal and the reference signal input are compared for small deviation in phase by the phase detector 11. Large phase deviations are detected by the macro phase detector 28. Whenever the filter 30 overflows, the counter 15 representing the locally generated variable signal is reset to match the reference signal input with regard to phase. When the locally generated variable signal is more than a certain amount out of phase with the reference signal, the macro phase detector 28 feeds pulses to the digital filter 30. The filter 30 after receiving a sufficient number of pulses in the same count direction will overflow or underflow to furnish pulses to the successive frequency approximation register 33. This latter circuit makes course adjustments to the phase track counter and the frequency track counter. Such adjustments quickly bring the locally generated signal frequency close to the frequency of the reference signal.

Considering the entire circuit as a servo loop, damping is introduced by the phase track counter 35 operating at half rate relative to the frequency track counter 24.

Having an understanding of the preferred circuit, it should be understood that the signal output on lead 18 from the ÷N circuit 15 represents a locally generated alternating current signal whose frequency and phase is synchronized with that of the reference signal furnished at terminal 10. Voltage controlled oscillator 63 operates at a frequency that can be varied by application of a control signal thereto. The ÷N circuit 15 constitutes means coupled responsively to the oscillator 63 for providing the locally generated signal at a frequency that is equal to 1/N times the oscillator frequency where N is a positive integer. In this example, the value of N is 256, however, such value can readily be altered by changing the scale factor of counters 66 and 67 in a known manner.

The phase detector 11 constitutes means for producing a first and second pulsed output, respectively, on leads 50 and 53, whenever the locally generated signal leads or lags the reference signal. The frequency track counter 24 constitutes means for establishing a first count that is in part a function of the difference between the number of pulses in the first and second outputs, namely those appearing at leads 50 and 53 after scaling through the filter 21. The digital-to-analog converter 61 constitutes means coupled to an output of the frequency track counter 24 for providing the control signal necessary to alter the frequency of oscillator 63 in proportion to the count established in circuit 24.

The macro phase detector 28 in conjunction with the digital filter 30 constitutes the single means 200 shown in the phantom outline in FIG. 1 for producing a signal whenever the phase difference between the reference signal and the locally generated signal exceeds a predetermined magnitude for a given interval of time. Additional means included within the phantom outline box 201 in FIG. 1 responds to the signal from filter 30 for replacing the count in frequency track counter 24 in a direction tending to reduce the phase difference. The phase track counter 35 may be thought of as a first register means for storing a second count. In such a case the successive frequency approximation register 33 constitutes means for establishing the second count for introduction into the first register, namely phase track counter 35. The second count after being stored in phase track counter 35 is transferred to frequency track counter 24.

Another way of viewing the circuit is that the phase detector 11 and macro phase detector 28 constitute, along with their respective filters 21 and 30, means responsively coupled to receive the reference signal and compare the phase thereof with the locally generated signal for providing output signals indicative of a leading or lagging phase relationship. For coupling the output signals to the first count storing means (frequency track counter 24) there is provided, in addition to the direct connection from filter 21 to counter 24, the combination 201 plus ÷2 circuit 23 and the various connections therebetween. The clock signals applied directly to counter 55 change the count in counter 24 from one value to another value in one direction or the other depending upon a leading or lagging phase situation. For small phase differences each change in the output signals from filter 21 from a leading to a lagging or a lagging to a leading relationship operates to replace the count in counter 24 with another count from counter 35 having a value half way between the last occurring one and another values.

Each time the successive frequency approximation register 33 is brought into operation it introduces a gross change in the controlling count in counter 24.

Having described the presently preferred embodiment of the subject invention it should be apparent to those skilled in the art that various changes in construction can be incorporated without departing from the true spirit of the invention as defined in the appended claims.

What is claimed is:

1. A phase lock loop system for synchronizing the frequency and phase of a locally generated alternating current signal with a reference signal comprising in combination an oscillator whose frequency can be vaired by application thereto of a control signal, means coupled responsively to said oscillator for providing said locally generated signal at a frequency that is equal to 1/N times said oscillator frequency where N is a positive integer, means for storing a first count and having an output, means coupled to said output of said first count storing means and to said oscillator for providing said control signal to vary the frequency of said oscillator as a function of said first count, means responsively coupled to receive said reference signal and compare the phase thereof with said locally generated signal for providing output signals indicative of a leading or lagging phase relationship, respectively, and means for coupling said last mentioned output signals to said first count storing means for changing said first count in a direction tending to bring said locally generated signal into frequency and phase coincidence with said reference signal; said output signal coupling means including means for changing said first count from a first value to a second value in one direction in response to said output signals corresponding to a leading phase relationship and in the opposite direction in response to said output signals corresponding to a lagging phase relationship, and means responsive to each change of said output signals that is indicative of a reversal in sign of said phase relationship for replacing said first count in said first count storing means with another first count having a value half way between the last occurring first and second values.

2. A phase lock loop system according to claim 1, characterized in that said means for providing output signals comprises means responsively coupled for receiving both said reference signal and said locally generated signal, said last mentioned means producing a first and second pulsed output, respectively, as a result of said locally generated signal leading or lagging said reference signal, said pulsed outputs being applied as output signals through said output signal coupling means to said first count storing means for causing said value changes in said first count.

3. A phase lock loop system according to claim 2, characterized in that said means for providing output signals further comprises means responsively coupled both to an output of said means for providing said locally generated signal, and to means for receiving said reference signal, for producing one of said output signals whenever the phase difference between said reference signal and said locally generated signal exceeds a predetermined magnitude for a given interval of time, said one of said output signals being applied through said output signal coupling means to said first count storing means for effecting a gross change in said first count in a direction tending to reduce said phase difference.

4. A phase lock loop system according to claim 3, characterized in that said output signal coupling means comprises: a first register means for storing a second count; means for establishing said second count for introduction into said first register, said last mentioned means being coupled to said first register and having a sequence of operation wherein at least within said sequence a series of counts are established with each count differing from the preceding count by an amount given by the expression $a/2^{(n-1)}$ where a is a constant and n is a positive integer representing the position of the count in the sequence, each successive count being either smaller or larger than the immediately preceding count depending upon whether said locally generated signal is leading or lagging said reference signal; further means coupling said one of said output signals from said output signal producing means to said second count establishing means for causing said last mentioned means to advance step by step through the positions of said sequence; and means for transferring said second count from said first register to said first count storing means as a substitution for the count in the latter means.

5. A phase lock loop system according to claim 4, characterized in that said means for replacing said first count for each reversal of phase relationship comprises means for dividing by two the number of pulses appearing in each of said first and second pulsed output from said pulsed output producing means and feeding the resultant scaled down output as an addend or subtrahend, respectively, to said first register means to modify said second count.

6. A phase lock loop system according to claim 5, characterized in that additional means are provided responsive to said reference signal for detecting loss or interruption thereof and freezing said first count at its value established immediately prior to said loss or interruption of the reference signal, said freezing of said first count being maintained until said reference signal reappears.

7. A phase lock loop system according to claim 3, characterized in that said one of said output signals consists of a series of pulses commencing after said interval of time and continuing for so long as said phase difference exceeds said predetermined magnitude, and means coupling said one of said output signals to said means for providing the locally generated signal for enforcing phase coincidence between said locally generated signal and said reference signal in response to each pulse in said series of pulses.

8. A phase lock loop system according to claim 1, characterized in that said means for providing output signals comprises means responsively coupled both to an output of said means for providing said locally generated signal, and to means for receiving said reference signal, for producing one of said output signals whenever the phase difference between said reference signal and said locally generated signal exceeds a predetermined magnitude for a given interval of time, said one of said output signals being applied through said output signal coupling means to said first count storing means for effecting a gross change in said first count in a direction tending to reduce said phase difference.

9. A phase lock loop system according to claim 8, characterized in that said one of said output signals consists of a series of pulses commencing after said interval of time and continuing for so long as said phase difference exceeds said predetermined magnitude, and means coupling said one of said output signals to said means for providing the locally generated signal for enforcing phase coincidence between said locally generated signal and said reference signal in response to each pulse in said series of pulses.

10. A phase lock loop system according to claim 2, characterized in that said means for replacing said first count for each reversal of phase relationship comprises means for dividing by two the number of pulses appearing in each of said first and second pulsed output from said pulsed output producing means and feeding the resultant scaled down output as an addend or subtrahend, respectively, to a second count storage means.

11. A phase lock loop system according to claim 1, characterized in that means are provided responsive to said reference signal for detecting loss or interruption thereof and freezing said first count at its value established immediately prior to said loss or interruption of the reference signal, said freezing of said first count being maintained until said reference signal reappears.

12. A phase lock loop system according to claim 11, characterized in that one of said output signals consists of a series of pulses commencing after a phase difference between said reference signal and said locally generated signal exceeds a predetermined magnitude for a given interval of time and continues as long as said phase difference exceeds said predetermined magnitude, and means coupling said series of pulses to said means for providing the locally generated signal for enforcing phase coincidence between said locally generated signal and said reference signal in response to each pulse in said series of pulses.

13. A phase lock loop system according to claim 1, characterized in that said output signal coupling means comprises: a first register means for storing a second count; means for establishing said second count for introduction into said first register, said last mentioned means being coupled to said first register and having a sequence of operation wherein at least within said sequence a series of counts are established with each count differing from the preceding count by an amount given by the expression $a/2^{(n-1)}$ where a is a constant and n is a positive integer representing the position of the count in the sequence, each successive count being either smaller or larger than the immediately preceding count depending upon whether said locally generated signal is leading or lagging said reference signal; further means coupling said one of said output signals from said output signal producing means to said second count establishing means for causing said last mentioned means to advance step by step through the portions of said sequence; and means for transferring said second count from said first register to said first count storing means as a substitution for the count in the latter means.

14. A phase lock loop system according to claim 10, characterized in that said output signal coupling means comprises: a first register means for storing a second count; means for establishing said second count for introduction into said first register, said last mentioned means being coupled to said first register and having a sequence of operation wherein at least within said sequence a series of counts are established with each count differing from the preceding count by an amount given by the expression $a/2^{(n-1)}$ where a is a constant and n is a positive integer representing the position of the count in the sequence, each successive count being either smaller or larger than the immediately preceding count depending upon whether said locally generated signal is leading or lagging said reference signal; further means coupling said one of said output signals from said output signal producing means to said second count establishing means for causing said last mentioned means to advance step by step through the positions of said sequence; and means for transferring said second count from said first register to said first count storing means as a substitution for the count in the latter means.

15. A phase lock loop system according to claim 14, characterized in that additional means are provided responsive to said reference signal for detecting loss or interruption thereof and freezing said first count at its value established immediately prior to said loss or interruption of the reference signal, said freezing of said first count being maintained until said reference signal reappears.

16. A phase lock loop system according to claim 10, characterized in that additional means are provided responsive to said reference signal for detecting loss or interruption thereof and freezing said first count at its value established immediately prior to said loss or interruption of the reference signal, said freezing of said first count being maintained until said reference signal reappears.

17. A phase lock loop system according to claim 1, characterized in that one of said output signals consists of a series of pulses commencing after a phase difference between said reference signal and said locally generated signal exceeds a predetermined magnitude for a given interval of time and continues as long as said phase difference exceeds said predetermined magnitude, and means coupling said series of pulses to said means for providing the locally generated signal for enforcing phase coincidence between said locally generated signal and said reference signal in response to each pulse in said series of pulses.

18. A phase lock loop system according to claim 13, characterized in that means are provided responsive to said reference signal for detecting loss or interruption thereof and freezing said first count at its value established immediately prior to said loss or interruption of the reference signal, said freezing of said first count being maintained until said reference signal reappears.

19. A phase lock loop system according to claim 18, characterized in that one of said output signals consists of a series of pulses commencing after a phase difference between said reference signal and said locally generated signal exceeds a predetermined magnitude for a given interval of time and continues as long as said phase difference exceeds said predetermined magnitude, and means coupling said series of pulses to said means for providing the locally generated signal for enforcing phase coincidence between said locally generated signal and said reference signal in response to each pulse in said series of pulses.

20. A phase lock loop system for synchronizing the frequency and phase of a locally generated alternating current signal with a reference signal comprising in combination an oscillator whose frequency can be varied by application thereto of a control signal, means coupled responsively to said oscillator for providing said locally generated signal at a frequency that is equal to 1/N times said oscillator frequency where N is a positive integer, means for storing a first count and having an output, means coupled to said output of said first count storing means and to said oscillator for providing said control signal to vary the frequency of said oscillator as a function of said first count, means responsively coupled to receive said reference signal and compare the phase thereof with said locally generated signal for producing an output signal whenever the phase difference between said reference signal and said locally generated signal exceeds a predetermined magnitude for a given interval of time, means for coupling said output signal to said first count storing means for effecting within a first range a change in said first count in a direction tending to reduce said phase difference, and additional means for changing said first count in smaller increments than said first range to reduce any phase difference for small phase differences.

* * * * *